United States Patent [19]

Ziv et al.

[11] Patent Number: 4,938,996
[45] Date of Patent: Jul. 3, 1990

[54] VIA FILLING BY SELECTIVE LASER CHEMICAL VAPOR DEPOSITION

[76] Inventors: Alan R. Ziv, 3129 E. Nora St., Mesa, Ariz. 85213; Michael N. Kozicki, 2035 S. Elm St., Tempe, Ariz. 85282

[21] Appl. No.: 180,780

[22] Filed: Apr. 12, 1988

[51] Int. Cl.$^5$ .......................... B05D 3/06; B05D 5/12
[52] U.S. Cl. ..................... 427/53.1; 427/96; 427/250
[58] Field of Search ...................... 427/53.1, 96, 43.1, 427/97, 250, 252, 253, 237; 29/846, 852

[56] References Cited

U.S. PATENT DOCUMENTS

| | | | |
|---|---|---|---|
| 4,359,485 | 11/1982 | Donnelly et al. | 427/53.1 |
| 4,465,716 | 8/1984 | Baber et al. | 427/53.1 |
| 4,511,595 | 4/1985 | Inoue | 427/43.1 |
| 4,526,807 | 7/1985 | Auerbach | 427/53.1 |
| 4,544,577 | 10/1985 | May | 427/97 |
| 4,624,736 | 11/1986 | Gee et al. | 156/643 |
| 4,659,587 | 4/1987 | Imura et al. | 427/35 |
| 4,699,801 | 10/1987 | Ito et al. | 427/53.1 |
| 4,701,592 | 10/1987 | Cheung | 219/121 |

OTHER PUBLICATIONS

Levy and Green Low Pressure Chemical Vapor Deposition of Tungsten and Aluminum for VLSI Applications, Mat. Res. Soc. Symp. Proc. vol. 71 1986 Materials Research Survey, pp. 229–247.
Ehrlich and Tsao, Laser Fabrication of Microstructures: Effect of Geometrical Scaling on Chemical Reaction Rates*, Mat. Res. Soc. Symp. Proc. vol. 17 (1983), Elsevier Science Publishing Co., Inc., pp. 3–9.
Dieter Bauerle, Angewandte Physik, Johannes Kepler Universitat A-4040 Linz, Austria, Laser–Induced Chemical Vapor Deposition, pp. 166–183.
Herman, Laser Fabrication of Integrated Circuits, University of California, Lawrence Livermore National Laboratory, Department of Physics, P.O. Box 808, L-278, Livermore, CA 94550, U.S.A., pp. 396–416.
R. Freese, Alphatronix Inc., Optical Disks Become Erasable, IEEE Spectrum, Feb. 1988, 0018-9235/88/0200-0041, pp. 41–45.
Allen, Jan, Edwards, Mazuk and Vernon, Optical and Thermal Effects in Laser Chemical Vapor Deposition, SPIE vol. 459, Laser Assisted Deposition, Etching, and Doping (1984), pp. 42–48.
Y. Rytz-Froidevaux and R. P. Salathé, Laser–Induced Deposition of Metals, SPIE vol. 459 Laser Assisted Deposition, Etching, and Doping (1984), pp. 55–60.
Ghate, Interconnections in VLSI, Physics Today, Oct. 1986, 0031-9228/86/1000, 58-09, pp. 58–66.
Diem, Fisk and Goldman, Properties of Chemically Vapor-Deposited Tungsten Thin Films on Silicon Wafers, Electronics and Optics, Thin Solid Films, 107 (1983), pp. 39–43.
Ehrlich, Osgood, Jr., and Deutsch, Direct Writing of Refractory Metal Thin Film Structures by Laser Photodeposition, Accelerated Brief Communication, Sep. 1981, vol. 128, No. 9, pp. 2039–2041.

*Primary Examiner*—Sadie Childs
*Attorney, Agent, or Firm*—Cahill, Sutton & Thomas

[57] ABSTRACT

Light from a Q-switched laser passes through a metal-containing gas and through a field oxide of an integrated circuit structure. The laser light is preferentially absorbed by an underlying substrate. The substrate, but not the oxide, is heated above a threshold temperature that allows rapid chemical vapor deposition of metal through a relatively deep via hole in the oxide. The oxide has low thermal conductivity. The upper portions of the via hole walls are not heated enough to allow deposition of metal thereon. The via hole therefore can be uniformly filled by deposition of the metal on the bottom of the via hole, with no obstruction or shadowing from buildup of deposited metal on the upper wall portions of the via hole.

13 Claims, 2 Drawing Sheets

VIA FILLING BY SELECTIVE LASER CHAMICAL VAPOR DEPOSITION

BACKGROUND OF THE INVENTION

The fabrication of very large scale and ultra large scale integrated circuits with line widths in the submicron region is placing increasing demands on processes such as metallization. Metal interconnections within the circuits not only need to have a pitch commensurate with the small geometries inherent in highly packed integrated systems but also must make electrical contact to underlying metal or doped semiconductor layers through small "high aspect ratio" contact or "via" holes. Contact or via formation in small linewidth circuits is currently a major problem that must be solved to allow microelectronics technology to progress to higher packing densities. It is a problem that is painfully evident in current silicon integrated circuit fabrication. Current methods of via filling lead to process-induced irregularities which in turn disrupt the electrical continuity of the connection in the contact hole. See "Low Pressure Chemical Vapor Deposition of Tungsten and Aluminum for VLSI Applications", by R. A. Levy and M. L. Green, in "Materials Issues in Silicon Integrated Circuit Processing", Editors Mark Whitmer, James Stimmel, Michael Strathman, Materials Research Society Symposia Proceedings, Vol. 71, April 15-18, 1986 and "Interconnections in VLSI", by Prabhakar B. Ghate, in Physics Today, October 1986.

Metallization is recognized as one of the the most critical processes in the fabrication of high density integrated circuits. The final level (or levels) of metal interconnect devices such as resistors, transistors, and capacitors and also connect various sections of the circuit together to form the final integrated system. The trend in MOS and bipolar integrated circuits has been toward higher levels of integration. The accompanying increase in component packing density has led to decreasing lateral and vertical dimensions within the devices and circuits. The metal lines which form the interconnections have become narrower to facilitate smaller pitch so that more wiring may be run in a smaller area. The contact holes and vias also have to be reduced to a similar scale to maintain the reduced pitch.

The contact holes not only are small, e.g., 0.5 micron across, but are formed by highly anisotropic etching (usually reactive ion etching). Steep sidewalls have the effect of maintaining a large contact area at the base of the via without making the top of the hole unacceptably large. Unfortunately, since the operating voltages of the integrated circuits have generally not been reduced (due to system considerations), the field oxide dielectric thicknesses cannot be reduced, and remain at about 0.5 to 1.0 micron. The depth-to-width aspect ratios of the nearly vertical walled via contact holes tend to be high, typically from 1 to 2.

Much work has been done on the electrical properties of reduced area contacts, specifically with reference to the resistance and reliability of the electrical contact to an underlying doped semiconductor region or to a previously deposited metal layer. However, non-uniformity of metal film thickness within the contact holes causes unreliable electrical contact through vias.

Aluminum commonly is used as a final or top level metal interconnection material and commonly is deposited by evaporation or sputtering. However, these techniques promote non-uniform metal deposition on topographical features (edges) in the underlying dielectric. The large arrival angle for the depositing metal at the top edges of features such as steps, combined with the low surface mobility of the adsorbed material, allows a thicker film of metal to form, typically up to 1.5 times the thickness of the metal film at a "flat" site on the substrate. The metal film then projects beyond the edge of the feature. This creates a problem for small geometry contact holes, because the "shadowing" effect of the projecting metal film at the top edge of the hole, combined with the small arrival angle at the bottom of the step, excludes sufficient metal deposition within the base and sides of the hole, resulting in poor electrical continuity.

The formation of metal films for interconnection layers by chemical vapor deposition (CVD) is a viable alternative to evaporation or sputtering. CVD processes are considerably more conformal over steps, and therefore should be more suitable for small geometry circuit fabrication. Aluminum or refractory metal films (e.g., tungsten) may be deposited by this method. CVD involves the pyrolytic decomposition of a vapor or gas containing the metal to be deposited on the surface of the substrate, which is heated by resistive heating elements, rf energy, or incoherent light. Low pressure CVD (LPCVD) involves deposition at low pressures and temperatures and the apparatus used can be relatively uncomplicated (i.e., a heated tube) compared to an atmospheric pressure system that relies on strict control of hydrodynamic aspects. The deposition reaction is generally heterogeneous and generally includes the following steps: (1) diffusion of reactants to the surface, (2) adsorption of the reactants at the surface, (3) surface events (e.g., chemical reaction, surface diffusion), (4) desorption of products from the surface, and (5) diffusion of products away from the surface.

In the case of tungsten deposition, the reactants commonly are tungsten hexafluoride in a hydrogen carrier, and the product is hydrogen fluoride HF. For aluminum deposition, the reactant is an organometallic such as triisobutyl aluminum (TIBA) and the products are various hydrocarbons.

Since the reaction steps in CVD are sequential, the slowest step largely governs the total deposition rate. Diffusion of the reactants to the surface can be the limiting step in atmospheric pressure CVD but does not tend to be a limitation at low pressures, since diffusion then is considerably more rapid. However, film formation at reduced pressure also means that the deposition rate can be considerably smaller as the partial pressure of reactant, and hence the amount (density) of metal containing species, is lower. The reactant gas pressure is chosen to maintain a reasonable deposition rate.

In the case of blanket film deposition of thick (i.e., greater than 0.5 micron) metal layers, non-uniform film formation still can occur on the edges of steep steps with CVD. If the deposition pressure is increased to increase deposition rates, or if the reaction temperature is reduced to avoid gas phase reactions, the film will begin to deposit non-conformally. The net effect is, as in the case of evaporation and sputtering, a thicker film surrounding the top of the step. This is not normally a great problem for CVD metallization unless the step is a small, high aspect ratio via hole. In this case the hole is gradually closed off, which interferes with transport of reactants to the base of the hole. Hence, the contact hole may be inadequately filled by the metal. For example, FIG. 1A shows a via hole 4 in an oxide layer 3 formed on a silicon substrate 2 of a wafer 1. FIG. 1A shows how via hole 4 is filled during a typical deposition of an aluminum layer 6 on the upper surface of field oxide 3. Metal preferentially is deposited on the upper edge of the via step 4, forming shoulders 7A that tend to close off lower portions of the via hole. Insufficient aluminum is deposited to completely fill the lower portions of the via hole. The result is formation of voids in the via and thinned metal film on the lower portion of the via hole walls, resulting in inadequate electrical contact to the metal 6A deposited on the substrate 2 (or doped region or previously deposited metal thereon) at the bottom of via hole 4.

It is clear that an alternative method of metallizing small geometry contact holes is necessary to ensure adequate metal deposition within via holes and thereby preserve reliable electrical continuity. The way this may be achieved is to selectively or preferentially deposit metal in the holes without creating a "barrier" at the top of the hole for further deposition. Selective thermal CVD methods currently available allow selective deposition of materials such as tungsten in the contact holes but these rely on surface effects unique to the reactants, wafer surface, and system used. The reactants ($WF_6/H_2$) do not decompose to deposit tungsten on the oxide surface but do react on bare silicon, silicide, or metal. The mechanism for this is not well understood, but is thought to be due to the fact that silicon atoms in the silicon dioxide are not available for the initial reduction of the reactant.

The main drawbacks of these selective CVD methods are: (1) tungsten will deposit on irregularities, randomly distributed sites which allow a reduction of the tungsten hexafluoride reactant, on the surface of the oxide to form particles, and (2) lateral encroachment of metal due to silicon consumption occurs on the surface of the silicon at the base of the contact, and severely limits the minimum spacing of contact structures. While these effects may be tolerable for present geometry sizes, problems could be encountered due to contamination by the metal particulates or disruption of underlying shallow junctions after silicon consumption in smaller submicron circuit technologies. Similar selective CVD methods do not exist for aluminum, since blanket film formation occurs. Deposition cannot be made selective by utilizing surface reaction conditions as in the case of tungsten, because the aluminum readily deposits on silicon or silicon dioxide. This is one of the reasons why tungsten is being favored in new VLSI metallization schemes. See "Properties of Chemically Vapor-Deposited Tungsten Thin Films on Silicon Wafers", by Michael Diem, Michael Fisk and John Goldman, in "Thin Solid Films", Vol. 107, Pages 39–43 (1983) and "Laser-Induced Chemical Vapor Deposition" by D. Bauerle, in "Laser Processing and Diagnostics", D. Bauerle, Editor, Pages 166–182, and "Laser Fabrication of Integrated Circuits" by Irving P. Herman, in "Laser Processing and Diagnostics", D. Bauerle, Editor, pages 396–416.

SUMMARY OF THE INVENTION

It is an object of the invention to provide an apparatus and method for high rate deposition of small geometry metal vias of multilayer integrated circuit structures, especially those in which the depth to width aspect ratio of the vias is high, for example from one to two.

It is another object of the invention to provide a method and apparatus for filling via holes uniformly.

It is another object of the invention to achieve higher metal deposition rates in small geometry, for example, less than 1 micron, vertical via holes having high aspect ratios, in integrated circuits.

It is another object of the invention to deposit material in small, vertical holes having high aspect ratios.

It is another object of the invention to provide a technique for depositing metal in via holes in integrated circuit structures without depositing metal on upper surfaces of walls of the via holes, to thereby avoid formation of voids, discontinuities, or thinned regions in the deposited metal.

Briefly described, and in accordance with one embodiment thereof, the invention provides a chemical vapor deposition process using a Q-switched laser to pyrolytically decompose reactants, wherein the wavelength of laser light is chosen so that the beam energy passes mainly through the metal containing gas and the field oxide of an integrated circuit structure and is preferentially absorbed by the underlying substrate, which is heated above a threshold temperature that allows chemical vapor deposition of metal through via or contact holes having high aspect ratios directly onto the substrate or onto metal previously deposited on the substrate. Metal previously deposited on the bottom of a via hole also preferentially absorbs laser beam energy. The oxide, however, is not substantially heated, and no deposition of metal occurs on the upper surface of the walls of the oxide. This avoids "plugging" of the top of the hole before the lower portion of it is completely filled with deposited metal. The laser beam is raster scanned across the entire substrate, continuing to preferentially heat the substrate, including the exposed contact areas, until the holes are sufficiently filled to ensure good electrical continuity of the complete contact metallization system, or until the aspect ratios have been sufficiently lowered that ordinary metal deposition methods will be effective. Tungsten and aluminum are used in the described embodiments of the invention. The method described should be effective whenever there are via or contact holes through a material that is relatively transparent to a particular wavelength of light that is transmitted through the material to an underlying substrate which absorbs that wavelength, and it is desired to fill the via or contact hole with a material that can be deposited by thermal decomposition of a gas.

DESCRIPTION OF THE INVENTION

Laser deposition of materials from the vapor phase, e.g., polycrystalline silicon from silane, has been extensively studied in recent times. In laser CVD (LCVD), pyrolytic decomposition of a reactant vapor is utilized with a laser, rather than a hot furnace tube or incoherent light heating, as the heat source. The degree of control of deposition conditions attainable with a transient heat source such as laser is considerably higher than any other CVD method. Pyrolytic and photolytic decomposition have been examined, although the former is easier to control, as it relies on surface effects rather than gas phase reactions. In laser pyrolytic deposition, the laser beam is used to heat a particular region of the substrate to promote decomposition and deposition only in that region. Lines and other patterns and structures have been formed using this technique. The temperature profile created by the beam is critical, since deposition will only occur if the local substrate temperature is high enough for the decomposition to take place.

Published references that disclose the specifics of known laser pyrolytic deposition techniques include "Optical and Thermal Effects in Laser Chemical Vapor Deposition" by S. D. Allen, R. Y. Jan, R. H. Edwards, S. M. Mazuk, and S. D. Vernon, in Laser Assisted Deposition, Etching, and Doping, Susan D. Allen, Editor, Proceedings of the SPIE, Vol. 459, Pages 42–48, 1984, incorporated herein by reference, "Laser-Induced Deposition of Metals" by Y. Rytz-Froiclevaux and R. P. Salathe, in Laser Assisted Deposition, Etching, and Doping, Susan D. Allen, Editor, Proceedings of the SPIE, Vol. 459, Pages 55–60, incorporated herein by reference, "Laser-Induced Chemical Vapor Deposition" by D. Bauerle, in Laser Processing and Diagnostics, D. Bauerle, Editor, Pages 166–182, incorporated herein by reference, and "Laser Fabrication of Integrated Circuits", by Irving P. Herman, in Laser Processing and Diagnostics, D. Bauerle, Editor, Pages 396–416, incorporated herein by reference.

A further and highly significant factor with laser CVD is that the energy from the beam will be selectively absorbed in particular materials, depending on the wavelength of light used. For instance, silicon dioxide (which has a bandgap up to 8 eV) is relatively transparent to a wavelength of 1.06 microns (1.162 eV) but silicon (which has a bandgap of 1.11 eV) will absorb much of the energy. This wavelength also will be readily absorbed by metals, silicides and other small bandgap materials. This can normally be a disadvantage with laser annealing or laser deposition of lines over changing substrate materials, but it is a distinct advantage for selective metal deposition in deep, narrow contact holes in silicon dioxide. For optimum heating and substrate conditions, the laser light can be made to pass through the relatively transparent oxide to be absorbed by, and therefore heat, the underlying silicon or metal previously deposited on the underlying silicon.

Figure 1:
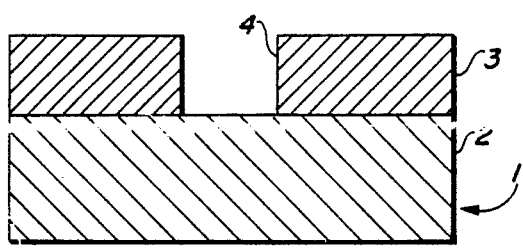
FIG. 1 is a section view diagram of a via hole through a field oxide on a substrate.
Figure 2A:
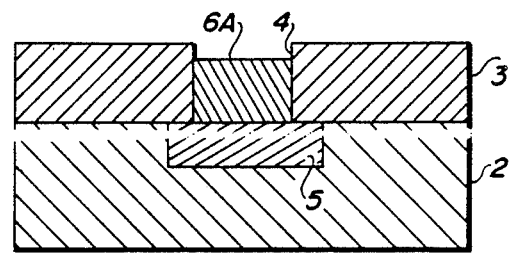
FIG. 2A is a section view diagram illustrating metal deposited in a via hole in accordance with the present invention.
Figure 1A:
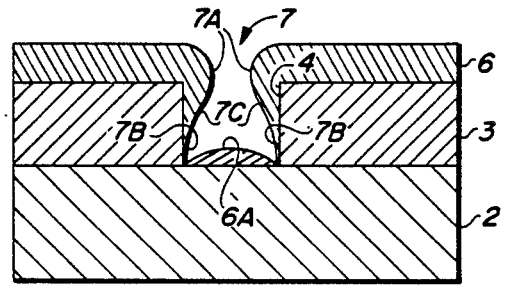
FIG. 1A is a section view useful in describing the problems associated with formation in the via hole of FIG. 1.
Figure 2B:
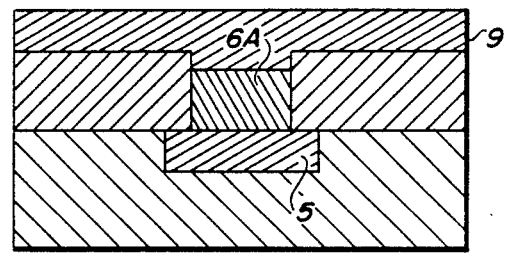
FIG. 2B is a section diagram illustrating a top layer of metal subsequently formed on the structure of FIG. 2A.
Figure 4A:
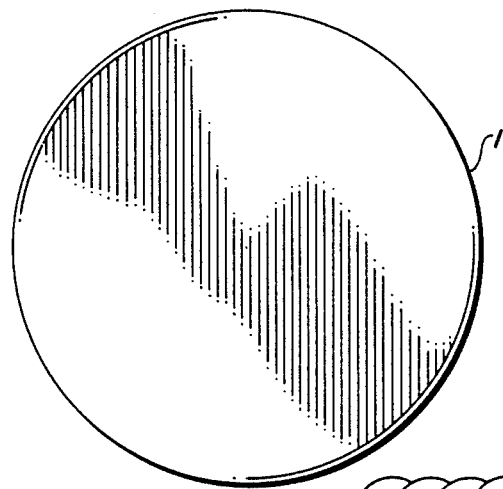
FIG. 4A is a plan view of a wafer.
Figure 4B:
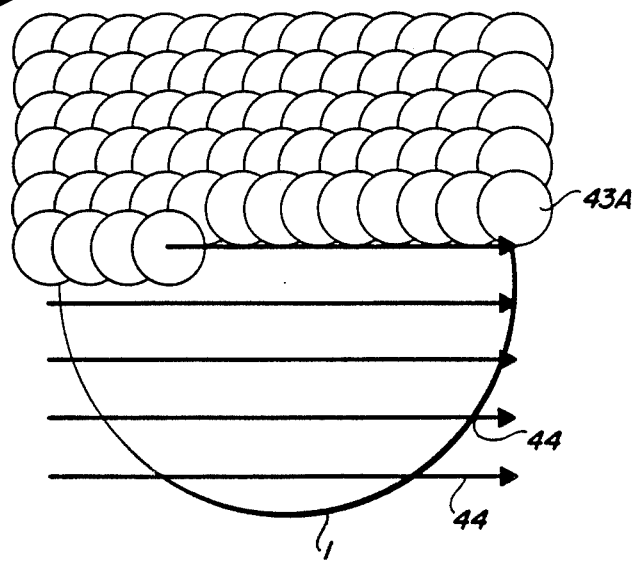
FIG. 4B is a diagram illustrating raster scanning of a laser beam across the wafer of FIG. 4A in accordance with the present invention.

If the laser is pulsed rapidly enough, e.g., by using a Q-switch arrangement, then the transient conditions can be such that the heating effect may be localized to the silicon surface. The beam passes through the overlying oxide and will heat only the silicon. If the beam is switched off after a short pulse, the temperature at the silicon-oxide interface begins to decay due to thermal conduction of heat away from the silicon-oxide interface (mainly through the more thermally conductive silicon substrate). This effect can be modeled mathematically, as subsequently described. The result is a thermal gradient through the oxide such that the oxide surface temperature is below the threshold for pyrolytic decomposition. Therefore, the silicon at the bottom of the contact holes (and also the silicon under the silicon dioxide dielectric) will be heated during the duration of the laser pulse to a sufficiently high temperature to cause pyrolytic decomposition to occur. Since only the silicon or metal previously deposited on the silicon and exposed at the bottom of the contact holes is exposed to the reactants, metal deposition only occurs on these areas, and no metal deposition occurs on the cooler oxide surface. The temperature differential is aided by the low thermal conductivity of silicon dioxide. As the metal layer is deposited in the bottom of the contact or via hole during repeated laser pulses, and the via hole is thereby gradually filled with the metal, the laser energy heats the metal at the bottom of the via hole without significantly heating the silicon dioxide (if there has not been a large degree of metal previously deposited on the oxide surface). This produces the via structure shown in FIG. 2A, wherein 6A designates metal deposited in via hole 4, making electrical contact to a doped region 5 or a previously deposited layer of metal thereon. As shown in FIG. 4B, a layer of metal 9 later deposited on top of the field oxide 3 makes electrical contact to the top of via 6A. A very small amount of metal deposition could be tolerated on the oxide surface, since very thin metal films of a few nanometers maximum thickness are transparent to the beam energy.

The above technique of filling contact holes with metal vias should work for contact holes through silicon dioxide o other insulators on silicon or a wide range of other underlying substrate materials. The technique should be suitable for forming contacts through vias to doped regions in silicon substrates, contacts to silicide gates, or contacts to previous metal layers formed on the silicon substrates prior to formation of the field oxide. It should also be effective for filling holes through any transparent layer on any absorptive substrate with any thermally depositable material.

Figure 3:
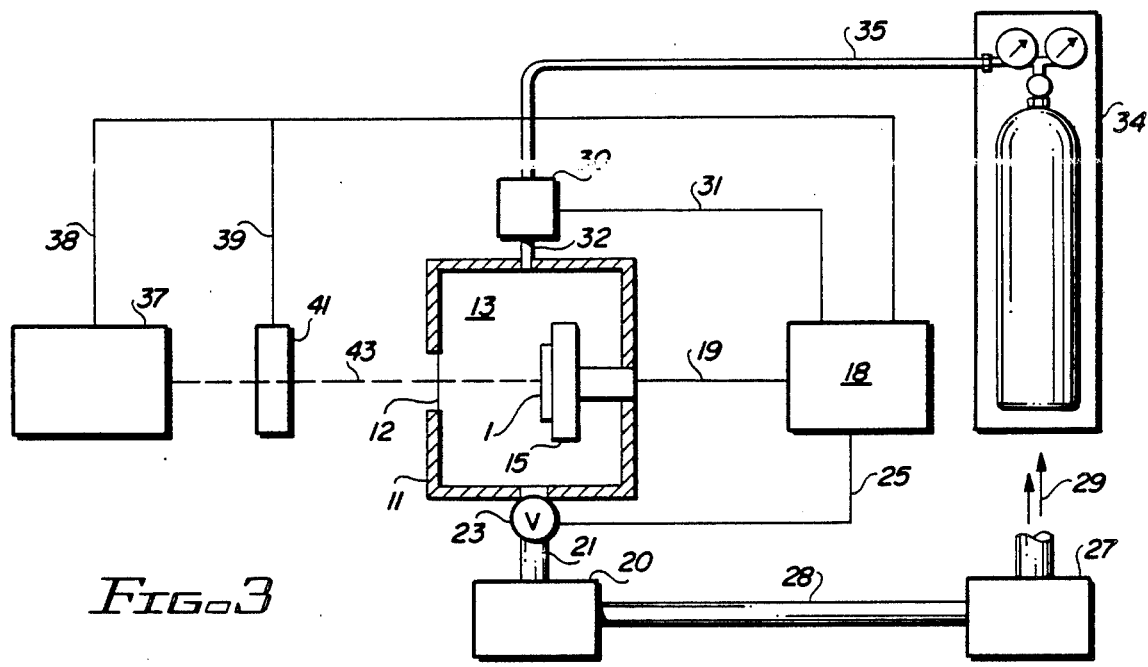
FIG. 3 is a schematic diagram of an apparatus used in practice of the present invention.

The apparatus for practicing the invention is shown in FIG. 3, and includes a suitable Q-switched laser system 37 (such as KORAD KY5AOQ YAG laser) which is used along with a laser beam scanning apparatus 41. A vacuum tight stainless steel reaction chamber 11 should be used. The chamber 11 will have a gas inlet 32 and pumping ports 21, pressure measurement (capacitance manometer) ports (not shown), and a quartz window 12 for the laser beam 43. A substrate holder consists of a temperature controlled chuck 15 which may be used to cool or heat the substrate 1, and temperature sensing elements (not shown) such as thermocouple arrays, in contact with the substrate 1, to measure the global temperature rise in the substrate 1.

Reactant and carrier gas sources 34 will be contained within conventional vented enclosures during use. Gas flows 35 are regulated by a conventional mass flow controller 30. A nitrogen purge function (not shown) also is included to ensure complete flushing of reactants after deposition. A butterfly valve 23 is used to throttle the exhaust outlet to aid in control of deposition pressure. A corrosion resistant vacuum pump 20 is utilized to evacuate the chamber 11 and maintain appropriate pressure conditions during deposition. The pump oil is filtered to prevent the accumulation of reaction products within the pump. The pump exhaust 28 is treated by a small CDO (Combustion, decomposition, oxidation) unit 27 to render the exhaust gases 29 safe. The gas system 30 is controlled by a microcontroller system 18 which monitors and regulates gas inlet and exhaust conditions via conductors 31 and 25, respectively. Microcontroller 18 also controls the temperature of the chuck 15 via conductor 19 and the beam deflection via conductor 39.

A rapidly pulsed laser is used. A several millimeter stationary beam 43 can be used for the deposition process. The beam may be scanned across the wafer or substrate 1 of FIG. 4A, applying one laser beam pulse to each successive overlapping beam spot 43A, as shown in FIG. 4B. Raster scanning is performed as indicated by arrows 44. The deposition metals specifically discussed here include tungsten (due to its desirable properties as an interconnection material, i.e., low resistivity and good stability during subsequent processing) and aluminum. Aluminum has a lower resistivity than tungsten but subsequent low temperature processing is required. The surface reaction kinetics are very different for tungsten and aluminum; the deposition characteristics will also differ.

The above described technique has not yet actually been utilized to construct vias through narrow deep via holes. However, there is a very solid theoretical basis, including mathematical modeling results described later and also known results of prior laser deposition techniques, to provide a very high degree of confidence that the techniques can be used with a minimal level of experimentation.

This selective laser chemical vapor deposition (SLCVD) process can be modeled theoretically in the manner described below. As noted before, the slowest of the sequential CVD reaction steps largely determines the overall deposition rate. The rate of that step in turn depends on the local temperature. The local temperature builds up during the laser pulse and decays via heat conduction while the laser is off.

While the laser is on, the temperature as a function of position and time is given by $$C \frac{\partial T}{\partial t} = K \nabla^2 T + G \qquad \text{eq (1)}$$

where C is the heat capacity, K is the thermal conductivity, and G is the energy absorbed from the laser per unit volume per unit time. If the laser is used in CW mode or with a long duration pulse, the G term in Eq.(1) may also include a contribution due to the chemical reactions. After the laser beam is removed, the temperature is given by $$C \frac{\partial T}{\partial t} = K \nabla^2 T. \qquad \text{eq (2)}$$

The solution of these equations gives the local temperature as a function of position and time. If the laser pulse duration is short as we propose to use for SLCVD, that result can be used in the expression for the rate constant to determine the metal deposition as a function of position and time.

Mass equations should be considered in addition to the above "energy equations". If $C_j$ represents the concentration of the j-th species, the mass equation for the j-th species is $$\frac{\partial C_j}{\partial t} = D_j \nabla^2 C_j + R_j \qquad \text{eq (3)}$$

where $D_j$ is the diffusion coefficient and $R_j$ is the rate of change of $C_j$ due to chemical reactions. For example, if the thermal decomposition of the j-th species is involved, $$R_j = -k_j C_j \qquad \text{eq (4)}$$

where $k_j$ is the rate constant for the thermal decomposition reaction. In these equations, both $k_j$ and $D_j$ depend on temperature through Arrhenius type equations; thus, we have, for example, $$k_j = A_j \exp(-a_j/RT) \qquad \text{eq (5)}$$

where $E_{aj}$ is the activation energy for the reaction.

If, as discussed previously, the duration of the laser pulse is short compared to the time scales of the chemical reactions, and if the diffusion is much faster than the chemical reactions, we first solve the energy equation for T as a function of position and time by using average values for C and K. The resulting expression is then substituted into Eqs.(3)–(5) to give $$\frac{\partial C_j}{\partial t} = -[A_j \exp(-E_{aj}/RT)] C_j. \qquad \text{eq (6)}$$

From the solution to Eq. (6), we can then estimate the rate of deposition as a function of time.

In order to develop an understanding of the dependence of the local temperature on position and time, we have solved the energy equation for the case of a slab of thickness d subjected to a delta function laser pulse. The solution for other laser time profiles can be generated from this result by convolution. Specifically, we have solved $$\frac{\partial T}{\partial t} = \kappa \nabla^2 T + \frac{\alpha I_0}{C} e^{-r^2/w^2} e^{-\alpha z} \delta(t), \ 0 < z < d \qquad \text{eq (7)}$$

with $$\frac{\partial T}{\partial z} = 0 \text{ at } t = 0 \text{ and } z = d \qquad \text{eq (8)}$$

where $\kappa = K/C$ is the thermal diffusivity, $\alpha$ is the absorption coefficient, w is the laser beam half-width, and $I_o$ is the laser energy per unit area. We find $$T(r,z,t) = T_0 + \frac{T_m w^2}{4\kappa t + w^2} \exp\left[-\frac{r^2}{4\kappa t + w^2}\right] \left( \frac{1 - e^{\alpha d}}{\alpha d} + \sum_{n=1}^{\infty} \frac{2\alpha d[1 - e^{-\alpha d}\cos n\pi]}{n^2 \pi^2 + \alpha^2 d^2} \cos\left(\frac{n\pi z}{d}\right) \exp\left[-\kappa \frac{n^2 \pi^2 t}{d^2}\right] \right) \qquad \text{eq (9)}$$

where $T_0$ is the initial temperature and $T_m = \alpha I_0/C = T(0,0,0) - T_0$ is the maximum temperature increase.

We have used typical values for Si to estimate the temperature decay profile predicted by Eq.(9). Several observations can be made.

First, Eq.(9) shows that the local temperature depends on the laser wavelength used through the dependence of T on α. The YAG laser output wavelength is 1.064 microns; this can be frequency doubled to produce 532 nanometers light. The absorption coefficient for Si at 532 nanometers is about fifty times that at 1.064 microns. An immediate consequence of this is that at 1.064 microns about fifty times the energy output is needed to produce the same maximum temperature as in the case of 532 nm. For the KORAD KY5 AOQ laser for example, this energy requirement is not a consideration. The absorption coefficient also affects the temperature decay time. However, it should be noted that in any case we observe no detectable spread in the temperature distribution while the temperature decays for a 350 micron thick Si slab. See FIG. 5, which shows computed values of relative surface temperature increase of the substrate as a function of normalized distance from the center of the beam, i.e., number of beam radii from the center of the beam. $T_m$ is the maximum temperature increase. Dotted line 47 represents the deposition temperature $T_{DEP}$ minus $T_0$, $T_0$ being the initial substrate surface temperature; $T_{DEP}-T_0$ is the surface temperature increase needed to reach the threshold for deposition. Curve 46A shows the relative surface temperature immediately after the end of a particular laser pulse. Curve 46B shows the surface temperature distribution about 5 microseconds after the end of the laser pulse, and curve 46C shows the temperature distribution about 300 microseconds after the end of the laser pulse. The curves illustrate that as the surface temperature decays, there is no sideways spreading of the temperature characteristic. That is, the energy flows perpendicularly to the substrate-oxide interface. This means that for our purposes only the z dependence of the energy equation is important. The curves of FIG. 5 were computed for a laser wavelength of 1.064 microns. The results show that the relative surface temperature decays to $0.7T_m$ in about 5 microseconds, to $0.5T_m$ in about 20 microseconds, and to $0.2T_m$ in about 300 microseconds. At a laser light wavelength of 532 nanometers, it reaches $0.7T_m$ in about 2 nanoseconds, $0.5T_m$ in about 10 nanoseconds, and $0.2T_m$ in about 130 nanoseconds.

As previously discussed, the experimental method has the following steps. The laser pulse heats the substrate surface, (i.e., the silicon/silicon dioxide interface and the bottoms of the vias). While the substrate surface temperature is elevated, metal deposition occurs in the contact holes. After the laser pulse is turned off, the substrate surface temperature decays. Since thermal diffusion in silicon dioxide is 10 to 100 times slower than in silicon, the heat conduction away from the substrate surface is primarily through the silicon, so the results of these calculations should be a good approximation. In addition, the temperature controlled chuck 15 could be used to cool the substrate 1 and increase conduction of heat away from the silicon/silicon dioxide interface.

By allowing the temperature to decay sufficiently between pulses, excessive heating (and resulting damage) is avoided and controlled deposition results. Also, the temperature of the silicon dioxide surface will never be high enough for deposition to occur thereon. In these terms, the effect of the laser wavelength on the temperature decay amounts to a trade-off. The slower decay at 1.064 microns will allow more reaction to occur per pulse, but we would have to use fewer pulses per second. The about 2,500 times faster decay at 532 nanometers would allow much less reaction to occur per pulse, but many more pulses per second could be used. Which of these in practice produces the best results will have to be determined experimentally.

We can, in any case, get a sense of the reaction results to be anticipated by making some estimates based on published information on laser writing. Published results show that with a gas pressure of about 400 torr, a 0.3 micron radius reaction zone, and a temperature of 1,000 degrees C, about $10^{22}$ molecules/cm$^2$/sec will be deposited. See page 7 of the article "Laser Fabrication of Microstructures: Effect of Geometrical Scaling on Chemical Reaction Rates" by D. J. Ehrlich and J. Y. Tsao, pages 3-18 in "Laser Diagnostics and Photochemical Processing for Semiconductor Devices", Editors R. M. Osgood, S. R. J. Brueck, and H. R. Schlossberg, Materials Research Society Symposia Proceedings, Vol. 17, 1982, incorporated herein by reference. For atoms of 0.125 nanometer radius, a monolayer contains about $2 \times 10^{15}$ atoms/cm$^2$. These figures would yield a deposition rate of about one monolayer per laser pulse if the local temperature were to average 1,000 degrees C for 200 nanoseconds as a result of the laser pulse. At a 1 kilohertz pulse repetition frequency, we would then expect to deposit about 1,000 layers or a depth of at least 0.2 micron in one second.

The temperature decay profiles predicted by Eq.(9) suggest that this estimate is conservative. At 1.064 microns, the temperature may average 1,000 degrees C for about 5,000 nanoseconds. This would produce twenty-five times the amount of deposition per laser pulse. A laser pulse rate of only 100 hertz, to allow for sufficient temperature decay between laser pulses, would then result in an increase in the anticipated deposition rate by a factor of 2.5. At 532 nanometers on the other hand, we may achieve the average 1,000 degrees C temperature for only about 2 nanoseconds and get about 1/100 of the amount of deposition per pulse. However, the temperature decay is so fast that the laser could possibly be pulsed as fast as 1 megahertz, resulting in a net tenfold increase in the anticipated deposition rate.

Since typical deposition rates for LCVD are 0.1 to 100 microns per second, these predictions fall in the lower part of the range and may be conservative. For tungsten and aluminum, we do not need such high temperatures since, for example, trimethyl aluminum dissociates, depositing aluminum, at about 160 degrees Centigrade. Aluminum can be deposited from tri-isobutyl aluminum at 220-300 degrees Centigrade, and tungsten carbonyl (W(CO)$_6$) decomposes, depositing tungsten, at temperatures as low as 175 degrees Centigrade. This latter reaction has products (i.e., CO) far more benign than does the WF$_6$/H$_2$ system and also obviates the problem of etching of the silicon dioxide surface by HF. While these lower temperatures suggest that a lower reaction rate will be achieved than used in the above calculations, higher partial pressures can compensate. In addition, maximum temperatures well above the threshold for deposition (but well below temperatures that could damage the materials) can be used which would greatly increase the effective reaction times.

Figure 5:
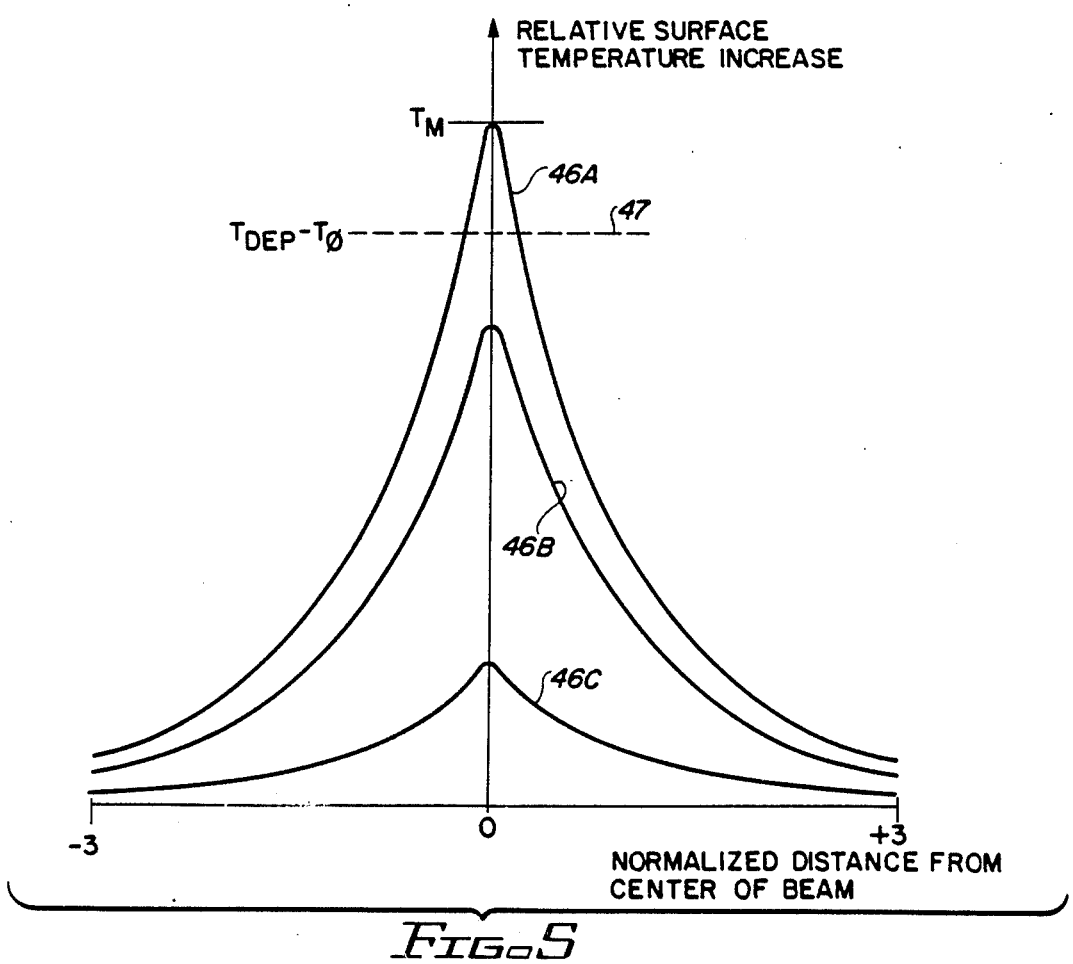
FIG. 5 is a graph useful in explaining the present invention.

The maximum temperature increase produced by the laser pulse is determined by the laser intensity through the equation $T_m = \alpha I_0/C$, where α is the absorption coefficient for laser light, $I_0$ is the laser intensity, and C is the heat capacity for the substrate material, as noted following eq.(9) above. If, for example, the laser intensity is chosen so that the temperature increase to the threshold temperature needed for deposition ($T_{DEP}-T_0$) is at 85% of the maximum temperature increase achieved ($T_m$) as shown by dotted line 47 in FIG. 5, a region of silicon having a diameter of 0.1625 beam-half-widths in radius will be at or above the threshold 47. For the KORAD KY5 AOQ laser, the TEM$_{00}$ beam has $\omega=0.75$ millimeters, $\omega$ being a half width of the laser beam. Hence, in that case each laser pulse would heat a 0.12 millimeter radius region of the silicon substrate to above the deposition threshold and deposition would occur in all via holes in that region. At higher maximum temperatures, the effective reaction region would be correspondingly larger. A higher maximum temperature is achieved by increasing the laser intensity. The threshold temperature for deposition is fixed by the reaction desired. If the maximum temperature is increased, the fixed threshold $T_{DEP}-T_0$ will become a smaller percentage of $T_m$. With reference to FIG. 5, this means that the dotted line 47 would be lower in this case. If line 47 is lower, it would intersect the initial surface temperature distribution curve 46A at a greater distance from the center. Thus, a larger region of the surface would be above the deposition threshold 47 and deposition would occur in all via holes in that larger region. Furthermore, the temperature in that larger reaction region would average at or above the deposition threshold for a longer time and more deposition per pulse would correspondingly result.

The above described process is highly compatible with multiple-step in-situ all-vacuum process systems wherein multiple layers are formed in one chamber at low pressure so that the substrates do not have to be brought into ambient air. This reduces the chances of associated particulate and chemical contamination which could introduce defects. The described technique would be compatible with systems in which tungsten or titanium silicide deposition preceeds chemical vapor deposition to ensure good adhesion properties. The same laser can be utilized to transiently anneal implanted regions to maximize dopant activation while minimizing the distribution by diffusion.

The conditions necessary in a substrate/overlying layer/deposited material system for the above described process of via filling by selective laser chemical vapor deposition to be effective are (1) preferential absorption of a certain wavelength of the laser light by the substrate, (2) thermal diffusion in the overlying layer much slower than in the substrate, and (3) a material that can be deposited by thermal decomposition of a gas that is essentially transparent to the wavelength of the laser light being used and that is so deposited at a temperature that will not damage th substrate/overlying layer system.

While the invention has been described with reference to particular embodiments thereof, those skilled in the art will recognize that various embodiments can be made without departing from the true spirit and scope of the invention.

We claim:

1. A method of forming an integrated circuit via connection, comprising the steps of:
   (a) providing a semiconductor substrate and an electrical connection site on the substrate, the substrate at the electrical connection site being absorptive of laser light;
   (b) forming an insulative layer on the substrate, the insulative layer being relatively transparent to the laser light;
   (c) forming a via hole in the insulative layer extending from the electrical connection site to an outer surface of the insulative layer;
   (d) providing a gaseous atmosphere containing atoms of a metal above the insulative layer;
   (e) aiming a laser beam through the atmosphere at the via hole;
   (f) repetitively pulsing the laser beam, the pulses having enough energy to heat material at the bottom of the via hole to a deposition threshold temperature to cause deposition of atoms of the metal onto the bottom of the via hole, the intervals between the pulses being great enough to allow enough thermal decay of the temperature at the interface between the substrate and the insulative layer by conduction of heat through the substrate that upper portions of the walls of the via hole are not heated to the deposition threshold temperature, whereby the via hole becomes filled with the metal without prior build-up of the metal on the upper portions of the walls of the via hole.

2. The method of claim 1 wherein steps (e) and (f) include absorbing heat from the laser beam in the substrate at the bottom of the via hole and in the surface of the substrate under the insulative layer, but not absorbing enough heat from the laser beam in the insulative layer to cause build-up of the metal on the walls of the via hole.

3. The method of claim 2 wherein the first hole is approximately 0.5 to 1 microns wide and approximately 0.5 to 1 microns deep, and wherein step (e) includes causing the laser beam to be substantially wider than the first hole.

4. The method of claim 2 including forming an additional via hole through the insulative layer, wherein the laser beam is wide enough to simultaneously heat material at the bottom of the additional via hole.

5. The method of claim 4 including raster scanning the laser beam across the surface of the insulative layer and across all of the via holes.

6. The method of claim 5 wherein the raster scanning includes applying one laser pulse to a first spot of substrate, aiming the laser beam at a second spot of the substrate partially overlapping the first spot, and applying one laser pulse to the second spot at the end of a first one of the intervals.

7. The method of claim 1 including forming a layer of metal on the outer surface of the insulative layer and on the top of metal already deposited in the via hole.

8. The method of claim 1 including supporting the substrate on a chuck and controlling the temperature of the chuck.

9. A method of filling a deep hole extending through a layer to a substrate, the layer being relatively transparent to laser light, the method comprising the steps of:
   (a) providing a gaseous atmosphere containing atoms of a thermally depositable material above the layer;
   (b) aiming a laser beam through the atmosphere at the hole;
   (c) repetitively pulsing the laser beam, the pulses having enough energy to heat the bottom of the hole to a deposition threshold temperature to cause deposition of atoms of the thermally depositable material onto the bottom of the hole, the intervals between the pulses being great enough to allow enough thermal decay of the temperature at the interface between the substrate and the layer by conduction of heat through the substrate that the upper portions of the walls of the hole are not heated to the deposition threshold temperature whereby the hole becomes filled with the thermally depositable material without prior build-up of the thermally depositable material on the upper portions of the walls of the hole.

10. The method of claim 9 wherein step (c) includes absorbing heat from the laser beam in the substrate at the bottom of the hole and in the substrate under the layer, but not absorbing substantial heat from the laser beam in the layer.

11. The method of claim 10 including forming an additional hole through the first layer, wherein the beam is wide enough to simultaneously heat material at the bottom of the additional via hole.

12. The method of claim 11 including raster scanning the laser beam across the surface of the layer and across all of the holes.

13. The method of claim 1 wherein step (e) includes making the beam wider than the via hole.

* * * * *